United States Patent
Huang et al.

(10) Patent No.: US 9,076,736 B2
(45) Date of Patent: Jul. 7, 2015

(54) PATTERNING METHOD FOR SEMICONDUCTOR DEVICE FABRICATION

(71) Applicant: TAIWAN SEMICONDUCTOR MANUFACTURING COMPANY, LTD., Hsin-Chu (TW)

(72) Inventors: Yen-Chun Huang, Taichung (TW); Ming-Feng Shieh, Yongkang (TW); Chih-Ming Lai, Hsinchu (TW); Ken-Hsien Hsieh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 83 days.

(21) Appl. No.: 13/828,885

(22) Filed: Mar. 14, 2013

(65) Prior Publication Data

US 2014/0273468 A1    Sep. 18, 2014

(51) Int. Cl.
*H01L 21/4763* (2006.01)
*H01L 21/44* (2006.01)
*H01L 21/308* (2006.01)

(52) U.S. Cl.
CPC ................................ *H01L 21/3088* (2013.01)

(58) Field of Classification Search
CPC combination set(s) only.
See application file for complete search history.

(56) References Cited

U.S. PATENT DOCUMENTS

| | | | |
|---|---|---|---|
| 7,862,962 | B2 | 1/2011 | Shieh et al. |
| 7,989,355 | B2 | 8/2011 | Shieh et al. |
| 8,110,466 | B2 | 2/2012 | Shieh et al. |
| 2009/0111270 | A1* | 4/2009 | Choi ............................ 438/694 |
| 2012/0241975 | A1* | 9/2012 | Farys et al. ................... 257/774 |
| 2013/0277823 | A1* | 10/2013 | Ogisu et al. ................... 257/734 |

* cited by examiner

*Primary Examiner* — Khaja Ahmad
(74) *Attorney, Agent, or Firm* — Haynes and Boone, LLP

(57) ABSTRACT

A method includes forming a first pattern having a first opening on a semiconductor substrate. The first opening is then filled. A second pattern of a first and second feature, interposed by the filled opening, is formed on the semiconductor substrate. Spacer elements then are formed on sidewalls of the filled opening, the first feature and the second feature. After forming the spacer elements, the material comprising first and second features is removed to form a second opening and a third opening. The filled opening, the second opening and the third opening are used as a masking element to etch a target layer of the substrate.

20 Claims, 16 Drawing Sheets

PATTERNING METHOD FOR SEMICONDUCTOR DEVICE FABRICATION

BACKGROUND

The semiconductor integrated circuit (IC) industry has experienced rapid growth. Technological advances in IC materials and designs have produced generations of ICs each having smaller and more complex circuits. In the course of IC evaluation, the geometry size or technology node (e.g., smallest component or line that can be imaged) has decreased. Shrinking technology nodes generally provide benefits by increasing production efficiency and lowering costs. However, these advances have also increased the complexity of fabricating of the circuits. For example, the scaling-down feature sizes can lead to fabrication challenges such as meeting process overlay margins. As the technology nodes shrink, the process overlay margins also shrink—and become more and more critical. One such process where the layout of the device demands alignment of closely-spaced features is in the fabrication of interconnect structures for the IC device. Thus, advances in IC fabrication are also needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Further, while the present disclosure may present embodiments directed to semiconductor device such as integrated circuits (ICs), one would appreciate that various devices and processes may benefit from the present disclosure including, for example, image sensors, thin film transistor liquid crystal displays (TFT-LCDs), light emitting diodes (LEDs), photomasks, and/or other suitable devices.

Figure 1:
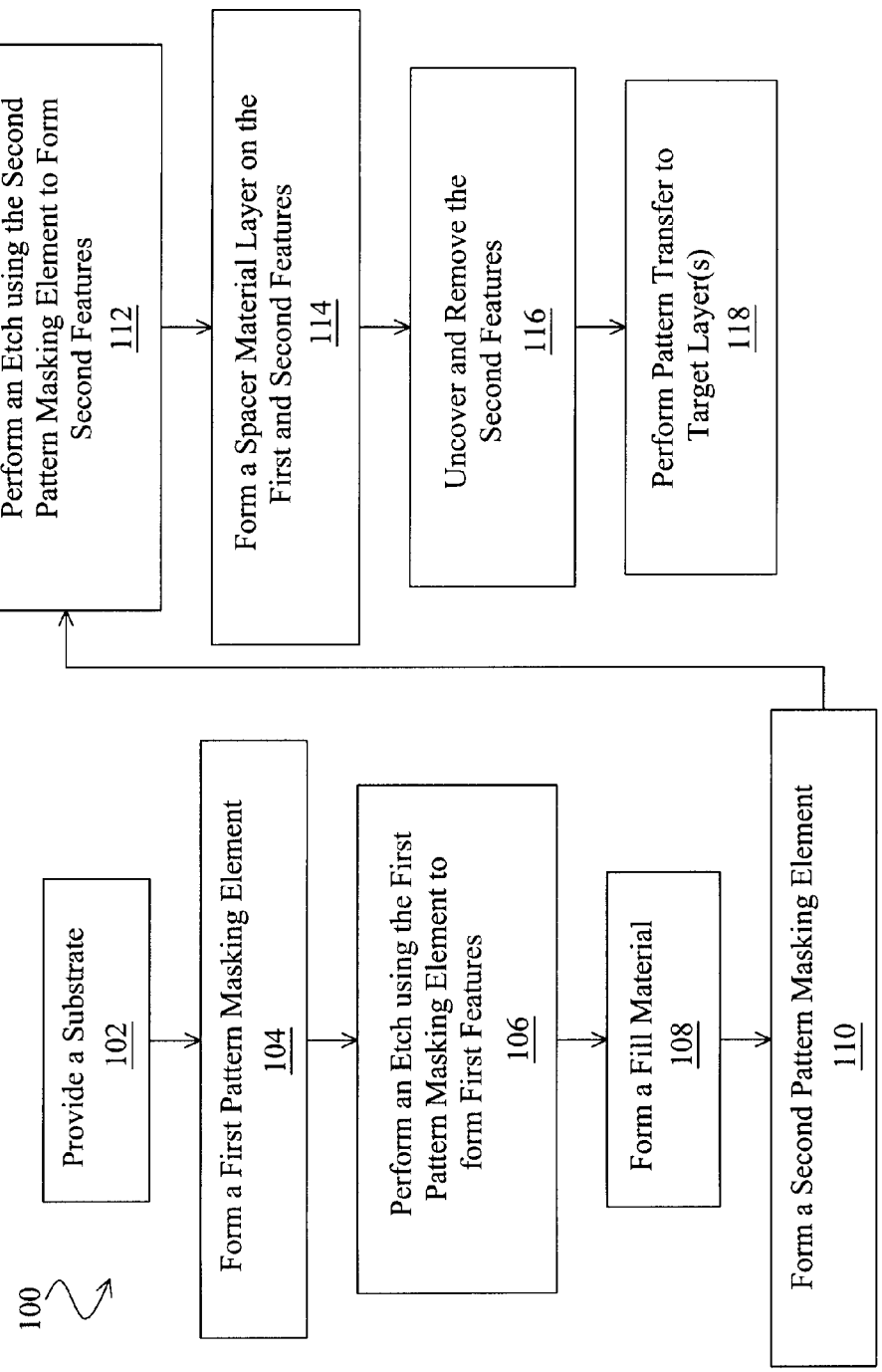
FIG. 1 is an embodiment of a method of fabricating a pattern of features of a semiconductor device according to one or more aspects of the present disclosure.

Illustrated in FIG. 1 is a method 100 of fabricating a pattern of features of a semiconductor device on a substrate. In an embodiment, the pattern of features may be used to form features of an interconnect structure such as a multi-layer interconnect (MLI) structures. For example, the patterns defined by FIG. 1 may be used to form a layer of an MLI structure. FIGS. 2-14 are perspective views of an exemplary embodiment of a device fabricated according to the method 100 of FIG. 1.

It is understood that the method 100 includes steps having features of a complementary metal-oxide-semiconductor (CMOS) technology process flow and thus, are only described briefly herein. Additional steps may be performed before, after, and/or during the method 100.

It is also understood that parts of the semiconductor device of FIGS. 2-15 may be fabricated by complementary metal-oxide-semiconductor (CMOS) technology process flow, and thus some processes are only briefly described herein. Further, the semiconductor device may include various other devices and features, such as additional transistors, bipolar junction transistors, resistors, capacitors, diodes, fuses, etc., but is simplified for a better understanding of the inventive concepts of the present disclosure. Furthermore, the device of FIGS. 2-15 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The semiconductor device of FIGS. 2-15 includes a plurality of semiconductor devices (e.g., transistors), which may be interconnected. The devices may be interconnected using an interconnect structure formed according the method 100. The interconnect structure may provide a physical and/or electrical connection between devices and/or between a device and a pad providing an external connection (e.g., to a package). An interconnect structure such as an MLI structure includes a plurality of conductive lines formed in various layers (e.g., metal 1, metal 2) with conductive vias interconnecting the lines. Dielectric material is provided in the interconnect structure, for example, interlayer dielectric (ILD) layers to provide isolation between conductive features.

With reference now to FIG. 1, the method 100 begins at block 102 where a substrate is provided. The substrate includes a plurality of layers. The substrate may include a semiconductor wafer having a plurality of layers formed thereon. In an embodiment, the semiconductor wafer is silicon. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate is a semiconductor on insulator (SOI). Alternatively, the substrate may include a non-semiconductor material such as a glass substrate, fused quartz substrate, and/or other suitable materials.

The substrate may include various features such as doped regions, dielectric features, conductive features such as multi-layer interconnects, and/or other suitable features. In one embodiment, the substrate includes features forming various semiconductor devices such as, for example, complementary metal-oxide-semiconductor field effect transistors (CMOSFET), imaging sensors, capacitors, memory cells, diodes, fin-type field-effect transistors (FINFETs), and/or other suitable devices.

Figure 2:
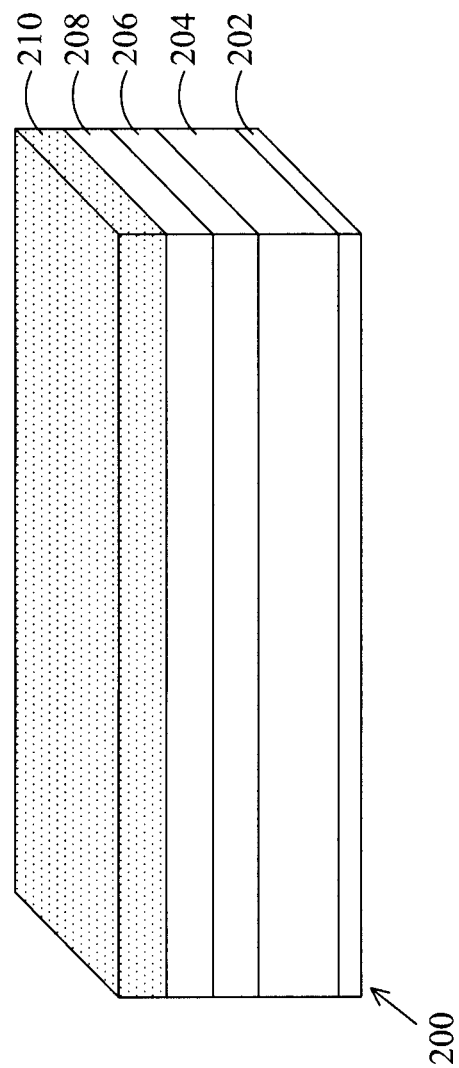
FIGS. 2-10, 12, 13*a*, and 14 illustrate perspective views of an embodiment of a device fabricated according to one or more steps of the method of FIG. 1.

Referring to the example of FIG. 2, a substrate 200 is provided. The substrate 200 illustrates a substrate 200 having a plurality of layers formed thereon. As illustrated, substrate 200 includes base layers 202, 204, and 206; target layer 208; and anti-reflective layer 210. However, these layers are exemplary and not intended to be limiting; one or more of the layers may be omitted, and additional layers may be added. Exemplary compositions for the layers formed on the substrate 200 are provided below, however, except as specifically defined by the claims hereto, these compositions are merely exemplary and not intended to be limiting.

In an embodiment, the base layer 202 includes silicon carbide. Other exemplary materials include other suitable etch stop materials such as silicon nitride. In an embodiment, base layer 204 includes a dielectric material such as a low-k or an extreme low-k dielectric material. Exemplary ELK materials include dielectric materials having a dielectric constant k less than approximately 2. The base layer 204 layer may include dielectric materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The layer may be deposited by a PECVD process or other suitable deposition technique. In an embodiment, the base layer 204 may be an interlayer dielectric (ILD) layer of a MLI structure.

In an embodiment, the base layer 206 includes a dielectric material such as tetraethyl orthosilicate (TEOS). Other exemplary compositions include un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In an embodiment, the target layer 208 includes a hard mask material. In one embodiment, the target layer 208 is TiN. In an embodiment, the anti-reflective layer 210 includes a nitrogen-free antireflective layer (NFARL).

The layers 202, 204, 206, 208, and/or 210 may be formed by suitable processes such as, for example, chemical vapor deposition (CVD) including plasma-enhanced CVD (PECVD), low-pressure CVD (LPCVD), or HDP-CVD process; spin-on coating; sputtering; physical vapor deposition (PVD); atomic layer deposition (ALD); and/or other suitable processes.

The method 100 then proceeds to block 104 where a first pattern masking element is formed on the substrate. The first pattern masking element may include a photoresist layer patterned to form one or more openings. The opening(s) may define a space between adjacent interconnect features (e.g., lines or vias).

Figure 3:
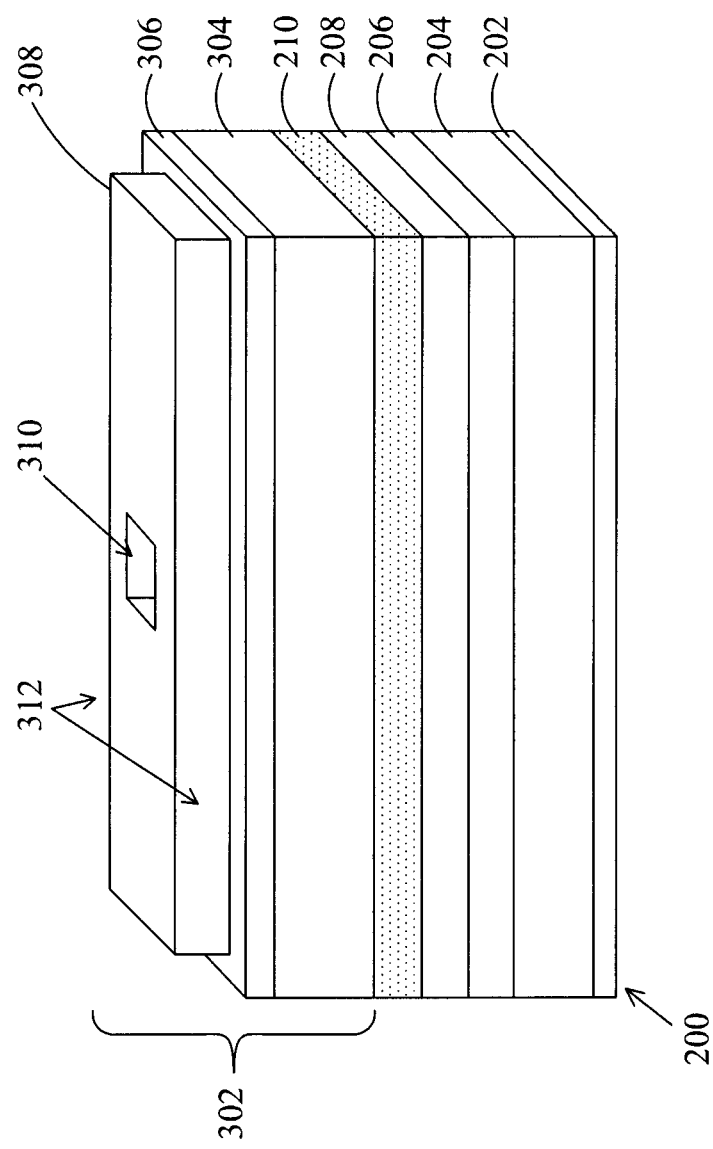

Referring to the example of FIG. 3, a tri-layer resist stack 302 is disposed on the substrate 200. The tri-layer resist stack 302 includes an underlayer 304, a middle layer 306 and an upper layer 308. The upper layer 308 may be a photosensitive resist material such as a 193-nm resist. The middle layer 306 may have a composition operable to provide a hard mask, used to transfer the pattern of upper layer 308 to the underlying layer 304. The underlying layer 304 may have a composition that suitable for patterning by the middle layer 306 and/or has anti-reflective properties. In an embodiment, the upper layer 308 is patterned using suitable lithography techniques. The pattern provides an opening 310. The pattern (opening 310) may also be referred to as a "cut pattern". The pattern also provides a regions 312 adjacent and spaced a distance from the opening 310. The regions 312 are also openings/gaps in the layer 308.

The method 100 then proceeds to block 106 where an etching process is performed to transfer the pattern defined by the first masking element to an underlying layer. The transferred pattern provides a first pattern of features. The first pattern of features may define regions between interconnect features (e.g., lines or vias), as described below. The pattern may be transferred using suitable etching processes such as dry etch, plasma etch, and/or wet etch.

Figure 4:
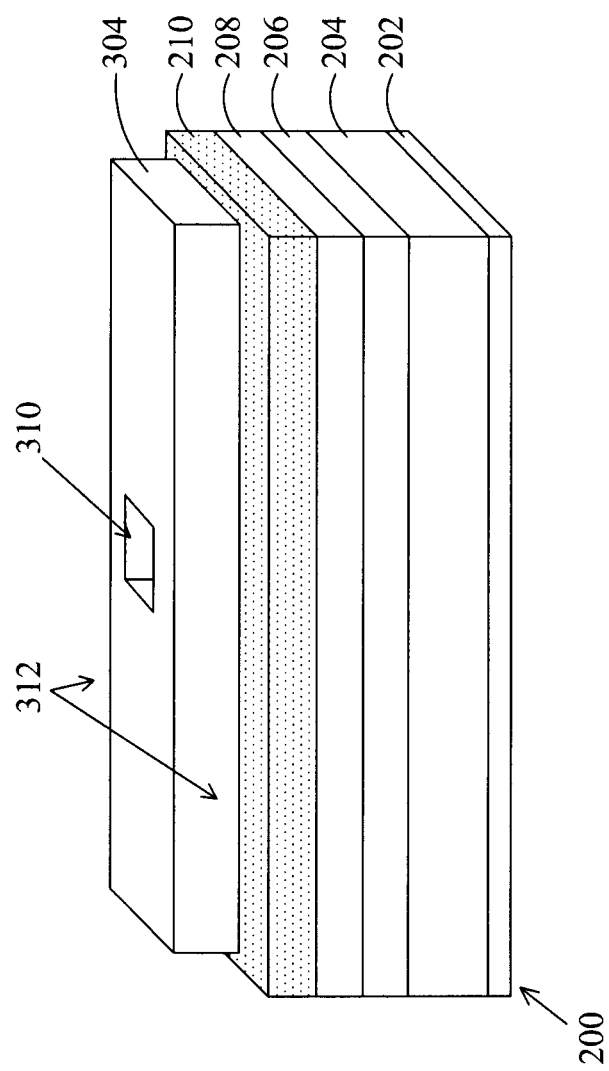

Referring to the example of FIG. 4, the pattern including opening 310 and regions 312 defined in the upper layer 308 of the tri-layer resist stack 302 is transferred to the layer 304. (It is note that while a tri-layer resist stack is described herein, one of ordinary skill in the art would recognize in other embodiments, other materials may be used to provide the same result for features defined on the layer 210 such as, for example, using a single layer or bilayer resist.) After transferring the first pattern defined in the upper layer 308 (FIG. 3), the upper layer 308 and/or middle layer 306 may be stripped from the substrate 200.

The method 100 then proceeds to block 108 where a fill material is formed on the substrate. The fill material may fill the regions defined by the first pattern. For example, the fill material may fill the opening(s) and/or gaps defined by the first pattern. In an embodiment, the fill material is a silicon-containing antireflective coating (Si-ARC). Exemplary Si-ARCs include inorganic ARCs such as SiON, silicon containing organic ARCs such as polysilanes, and/or other suitable compositions. In an embodiment, the silicon content is between approximately 30 and 40 atomic weight percent. The fill material may be formed using a spin-coating or other suitable deposition process. An etch back process may follow the deposition of the fill material, for example, a chemical mechanical polish (CMP) process or suitable etching process.

Figure 5:
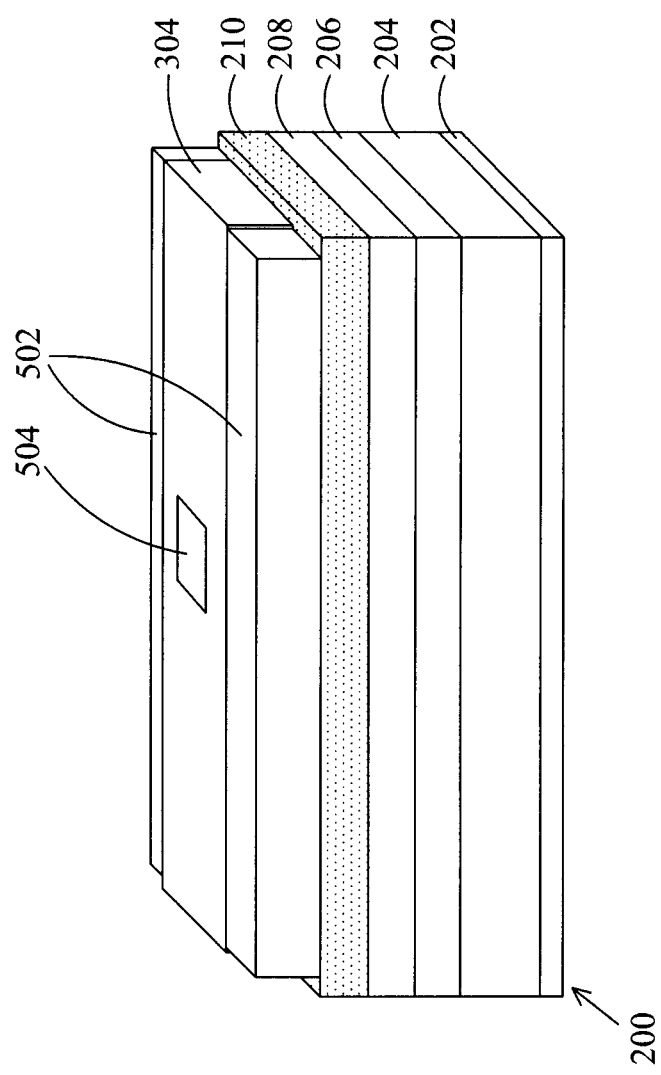
Figure 6:
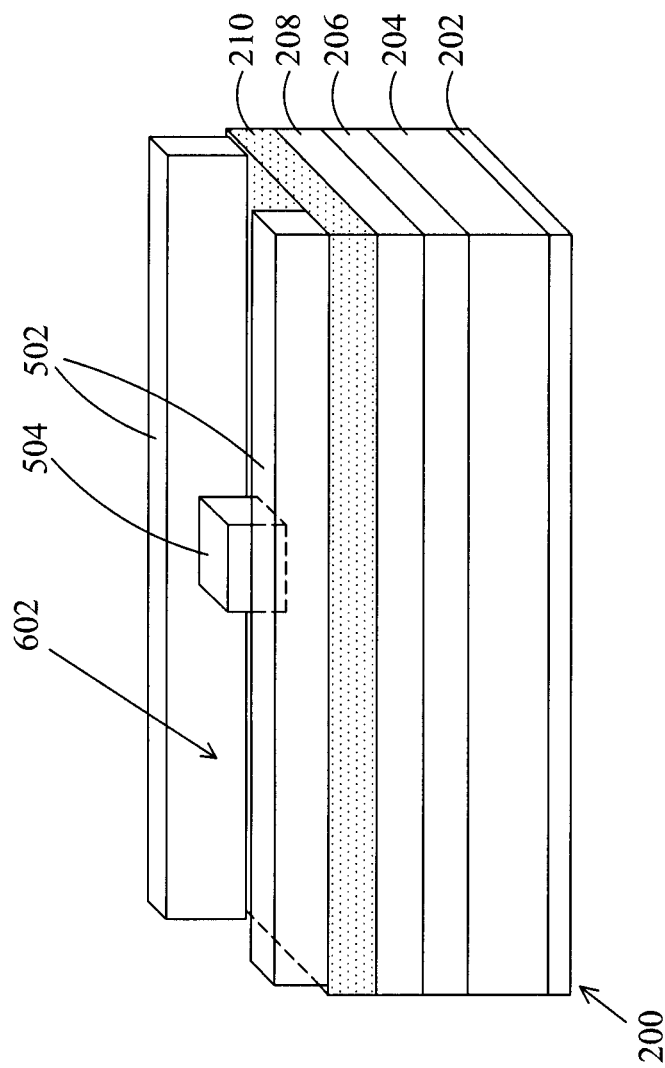
Figure 7:
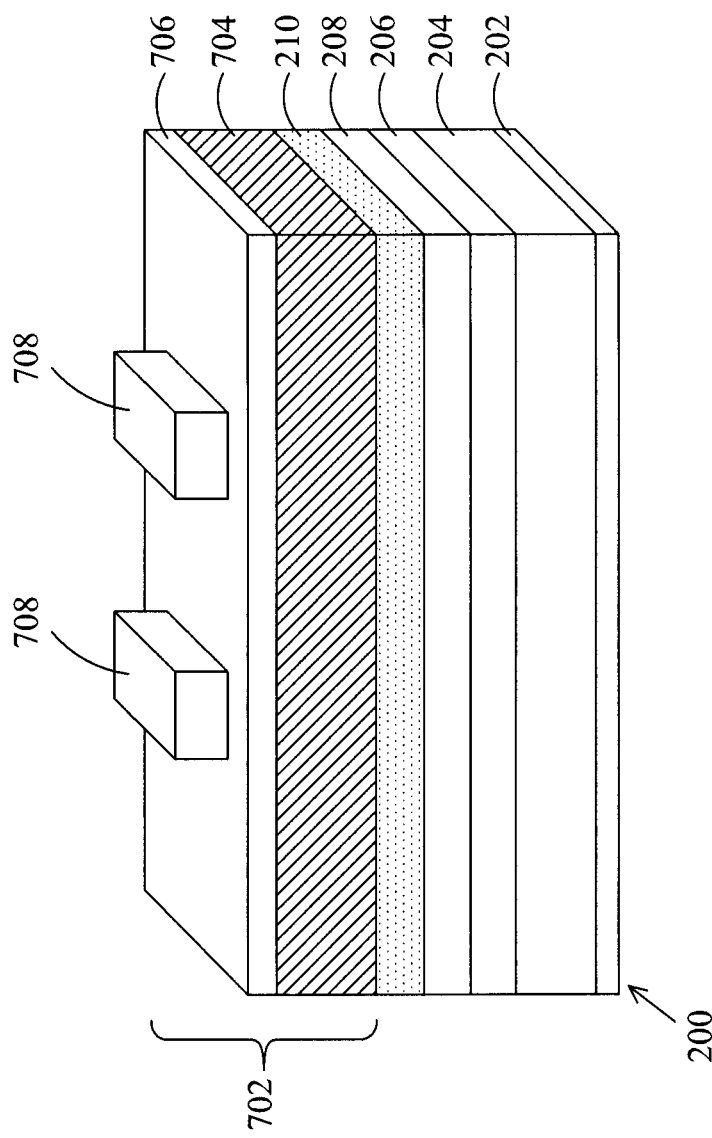

Referring to the example of FIG. 5, the openings (FIG. 4) are filled with fill material. In an embodiment, the fill material 502 is Si-ARC. The fill material fills the opening 402 providing a filled opening denoted 504. The fill material also fills the gaps 310 providing filled regions 502. After depositing a fill material, an etch back process or other planarization process (e.g., etch, chemical mechanical polish, etc.) may be performed to provide a surface of the fill material 502/504 substantially coplanar with that of layer 304.

In an embodiment, the method 100 and block 108 further includes stripping the layer used to define the first pattern after forming the fill material. In an embodiment, this includes stripping a first (under) layer of a tri-layer resist. Referring to the example of FIG. 6, the remaining portions of layer 304 are removed from the substrate 200 creating openings 602.

The method 100 then proceeds to block 110 where a masking element of a second pattern is formed on the substrate. The second pattern may include a plurality of features. For example, the second pattern may include a plurality of features formed of photoresist. The photoresist may include a tri-layer resist. The second pattern may define interconnect features (e.g., metal lines). Referring to the example of FIG. 7, a tri-layer resist 702 is disposed on the substrate 200. The tri-layer resist 702 includes an underlayer 704, a middle layer 706, and an upper layer 708. The upper layer 708 may be a photosensitive resist material such as a 193-*nm* resist. The middle layer 706 may have a composition operable to provide a hard mask, used to transfer the pattern of upper layer 708 to the underlying layer 704. The underlying layer 704 may have a composition that suitable for patterning by the middle layer 706 and/or has anti-reflective properties. In an embodiment, the upper layer 708 is patterned using suitable lithography techniques. As illustrated, the upper layer 708 is patterned to include a first and second feature; however, any number of features and configurations may be possible. In an embodiment, the second pattern 708 includes photoresist features. The photoresist features may be formed using suitable processes such as the formation of a layer of photoresist (e.g., spin-on coating, exposure to pattern, development of the exposed photoresist, baking processes, and the like).

The method 100 then proceeds to block 112 where an etching process is performed to transfer the pattern defined by the second masking element to an underlying layer. The transferred pattern provides a second pattern of features. The second pattern of features may define interconnect features (e.g., lines or vias), as described below. The pattern may be transferred using suitable etching processes such as dry etch, plasma etch, and/or wet etch. After the pattern is transferred, the first pattern (described above with reference to block 106) and the second pattern (described here in block 112) are provided on a layer of a device, in other words, the patterns are co-planar.

Figure 8:
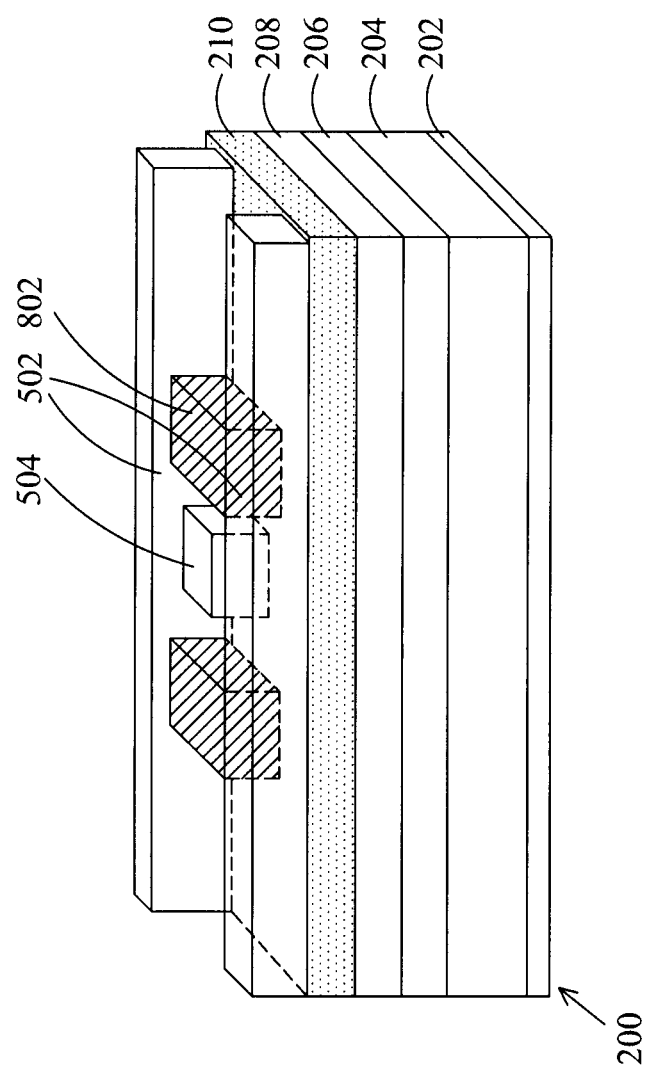
Figure 9:
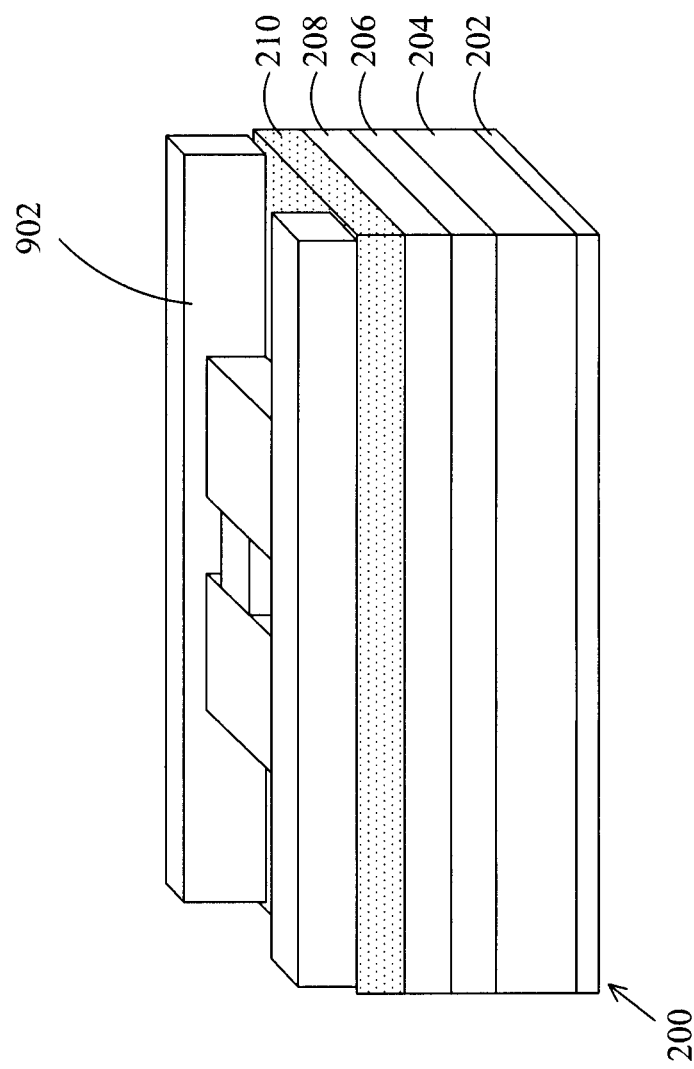
Figure 10:
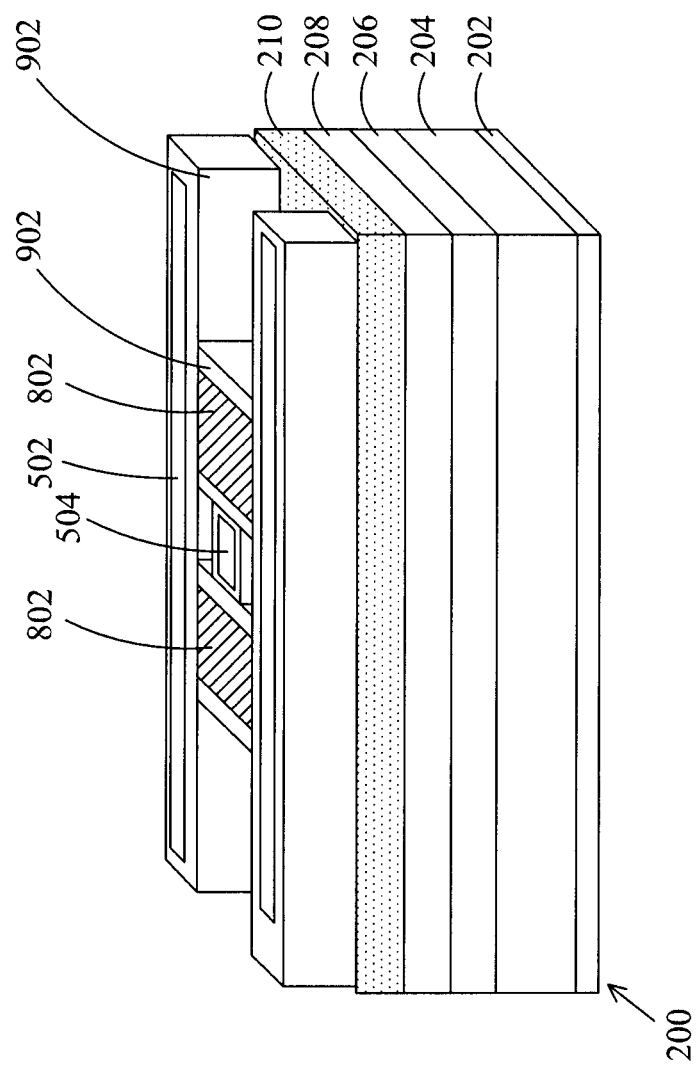

Referring to the example of FIG. 8, the pattern of features provided in layer 708 are transferred to the underlayer 704 formed on the layer 210. The pattern features formed using the second masking element defined in layer 708 (FIG. 7) are denoted as elements 802. (It is noted that while a tri-layer resist stack is described herein, one of ordinary skill in the art would recognize in other embodiments, other materials may be used to provide the same result for features defined on the layer 210 such as, for example, single layer or bilayer resists.) After transferring the second pattern defined in the upper layer 708 (FIG. 7), the upper layer 708 and/or middle layer 706 may be stripped from the substrate 200.

The method 100 then proceeds to block 114 where a conformal layer is formed on the substrate. The conformal layer may also be referred to as a spacer layer. The conformal layer may be a dielectric material. Exemplary materials include silicon dioxide, silicon nitride, silicon oxynitride, and/or other suitable materials. The conformal layer may be formed on the substrate including on the features defined by the first and second patterns, described above. Referring to the example of FIG. 9, a conformal or spacer material layer 902 is disposed on the substrate 200 including on the feature 504 (including its four sidewalls) and features 502 of the first pattern and the features 802 of the second pattern (including each features two sidewalls).

The method 100 then continues to block 116 where the features defined by the second pattern masking element are uncovered (e.g., the conformal spacer material removed from a top surface) and removed from the substrate. Referring to the example of FIG. 10, a material removal process is performed to remove the conformal material 902 from a top surface of the features 802. The material removal process may include a chemical mechanical polish (CMP) process, an etch-back process such as a wet etch, dry etch, plasma etch, and/or other suitable process. The etch back process may provide a substantially coplanar surface of the elements 502, 504, 902, and 802.

Figure 11:
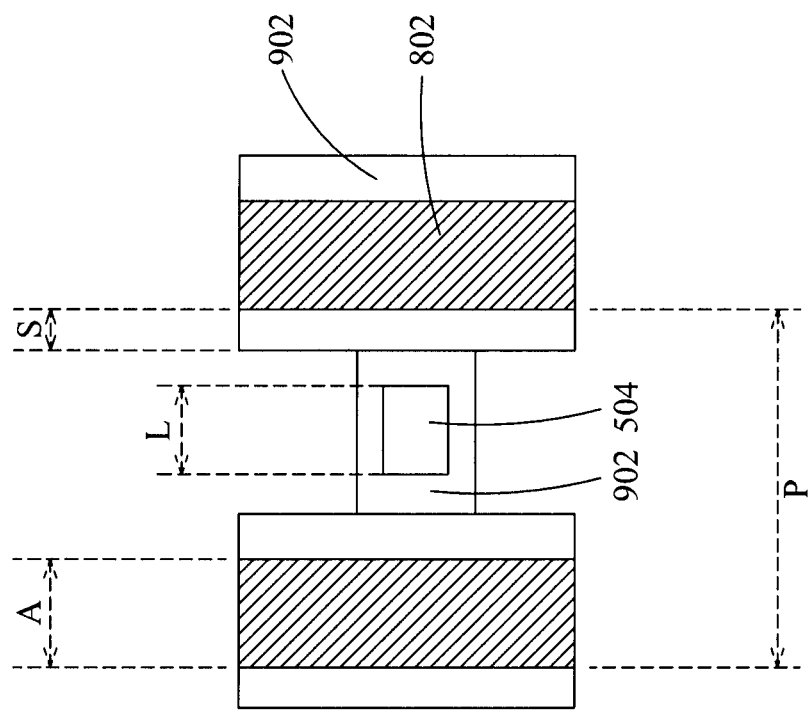
FIGS. 11 and 13*b* illustrate corresponding top views of the substrate.
Figure 12:
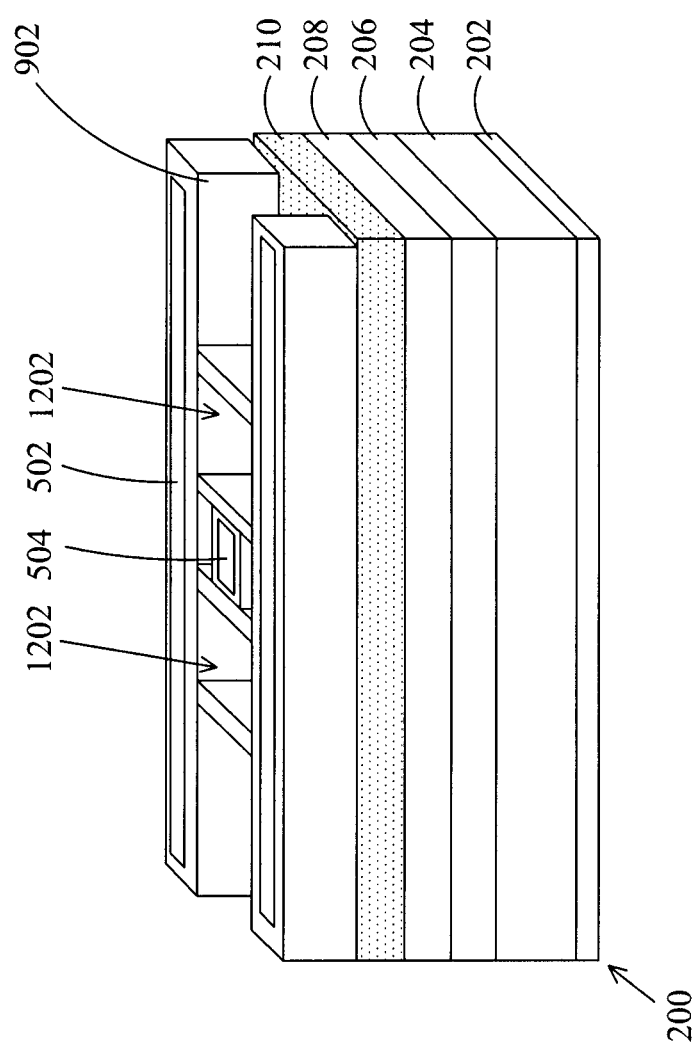
Figure 13A:
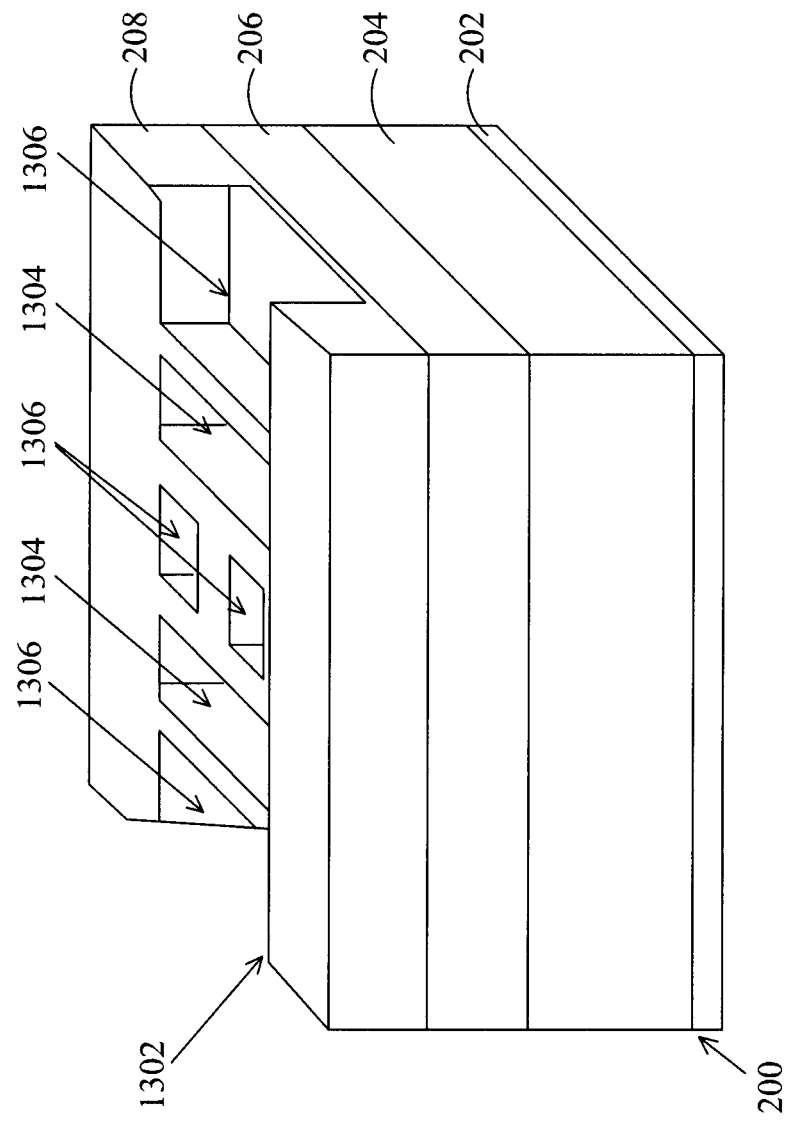
Figure 13B:
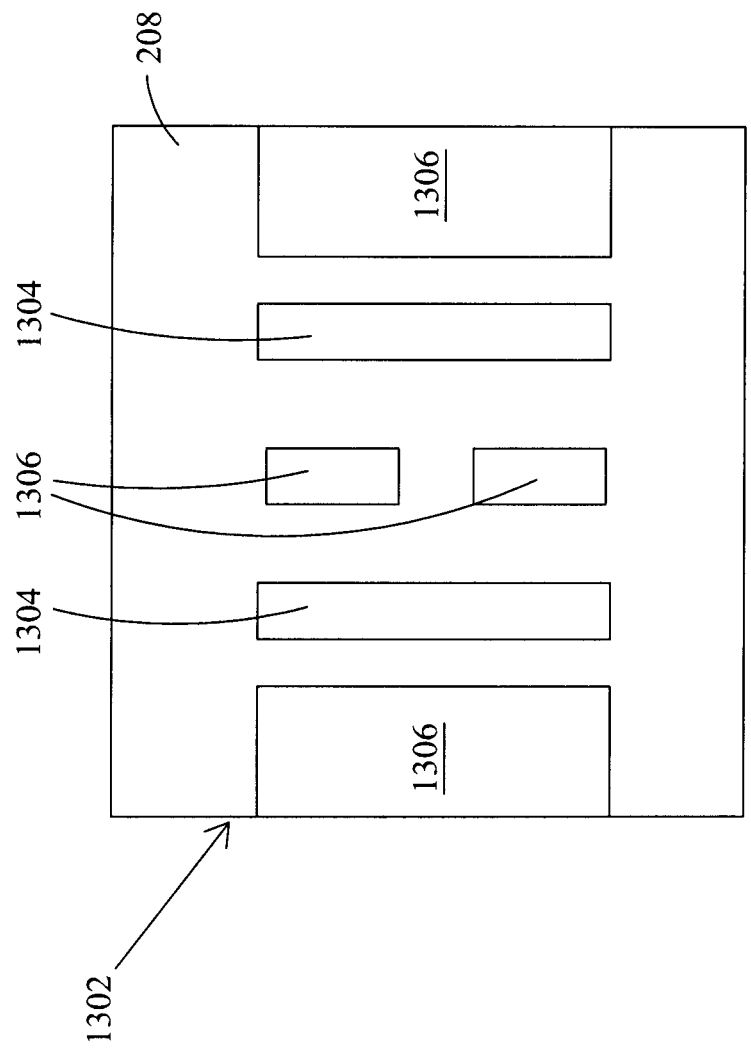

Referring now to FIG. 11, illustrated is a top view of a portion of the substrate 200. The features 802 have a width A. The filled opening 504 has a length L in a dimension interposing the features 802. The conformal material (spacer material) 902 has a thickness S at a sidewall of a feature. The thickness S may be substantially similar on all sidewalls of the features (e.g., 802 and 504). The features 802 have a pitch P.

Thus, when P is the second pattern feature pitch, A is the second pattern width, L is the first pattern (cut pattern) length and S is the spacer thickness, the following relationships may be observed. In an embodiment, the critical dimension (CD) variation of the first pattern is 2*S. In an embodiment, P−A−(4*S) is less than L. In a further embodiment, L may be less than P−A. The maximum overlay tolerance of the first pattern is S when L=P−A−(2*S). In an embodiment, P is approximately 90 nanometers (nm).

Continuing with block 116, after exposing a top surface of the features of the second pattern, the features are removed from the substrate. In an embodiment, the features of the second pattern are photoresist and are removed from the substrate using suitable stripping processes. Referring to the example of FIG. 12, the exposed features 802 (FIG. 10) are removed from the substrate 200. The removal of the features 802 provides openings 1202 with sidewalls defined by the spacer material 902.

The method 100 then proceeds to block 118 where the pattern is transferred to an underlying target layer(s). In an embodiment, the pattern is transferred to an underlying dielectric layer forming the isolation between interconnect features. In an embodiment, one underlying layer is a hard mask layer. Thus, the first (cut) pattern and second pattern define a single layer or level of the interconnect structure (e.g., metal 1, metal 2). Referring to the example of FIG. 13a and the top view of FIG. 13b, the openings 1202 (FIG. 12) are used as masking elements to form openings 1304 in the hard mask layer 208. The regions 502 and filled trench 504 and surrounding spacer layer 902 are used as masking elements to define openings 1306. The openings 1304 and 1306 together define a pattern 1302 provided in the hard mask layer 208. The pattern 1302 defines a layer of an interconnect structure.

The method 100 may continue to include transferring the pattern (e.g., 1302) to additional layers. In an embodiment, the pattern 1302 is used to define a conductive layer (e.g., metal line) of an interconnect structure such as by a damascene or dual-damascene process. For example, the pattern defined by the method 100 (e.g., hard mask) may be transferred to an underlying layer by using the pattern as a masking element to etch trenches in a dielectric layer such as an interlayer dielectric (ILD). A conductive material may then be plated into the trenches in the dielectric layer. In an embodiment, the conductive material formed in the trenches includes copper. However, other exemplary embodiments include conductive materials such as aluminum, copper alloys, tungsten, and/or other suitable materials.

Figure 14:
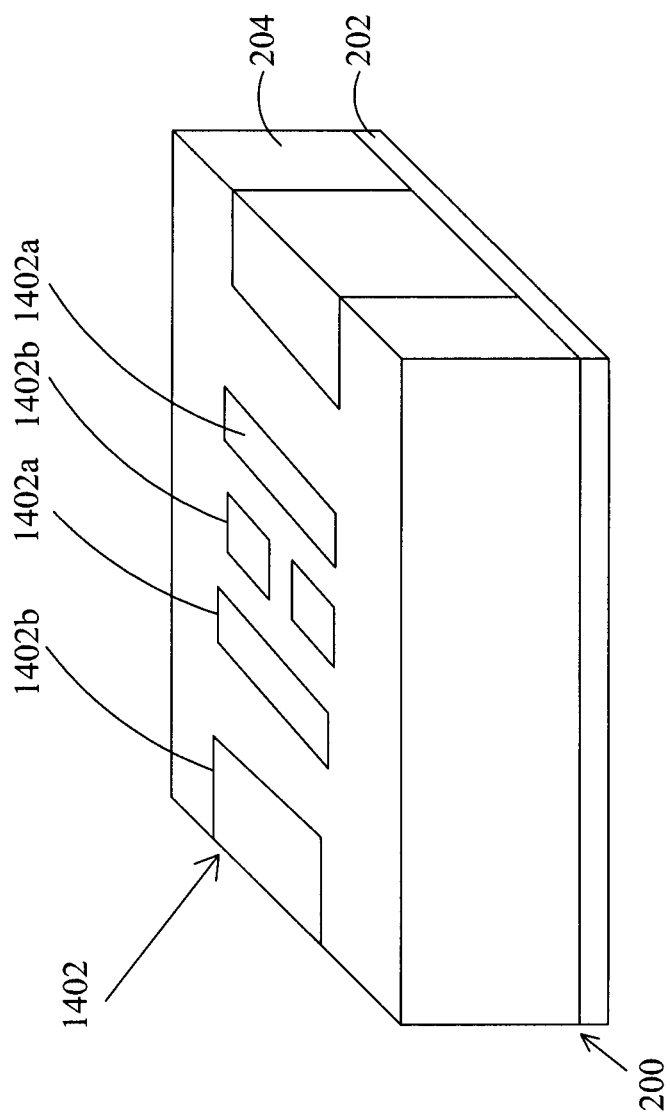

For example, using the example of FIG. 14, the pattern 1302 may be transferred to the base layer 204. In an embodiment, layer 204 is an interlayer dielectric layer (ILD). The pattern may be transferred using suitable etching processes using the openings 1302 of the layer 208 as masking element. The etching processes may include dry etch, wet etch or plasma etch processes. After forming the trenches in the layer 204, the trenches are filled with conductive material providing an interconnect line 1402. It is noted that the features 1402a of the interconnect feature 1402 may be referred to as being defined by a second pattern and the features 1402b may be referred to as being defined by the first pattern (as well as the second pattern). The features of 1402 may form a conductive line of an interconnect structure.

Thus, the method 100 may be used to form conductive lines of an interconnect feature. In other embodiments, however, other features may be defined using the steps of the method 100. For example, gate structures, fin structures for fin-type field effect transistors, and/or various other features of semiconductor devices. Some embodiments of the method 100 provide benefits such as an increase in the "cut" pattern (first pattern described above) critical dimension required and/or an increase in the overlay margin between the first and second patterns. One reason for this improvement may be that the first pattern (a "cut" pattern) is processed prior to the second pattern. This combination of first and second patterns allows for the spacer material deposition to be done in a single process. One example benefit is that the spacing between the second and first pattern is occupied by a spacer material, thus, providing for improved tolerance (e.g., x-direction tolerance of the first pattern with respect to the second pattern) and/or an improved overlay tolerance between patterns.

Figure 15:
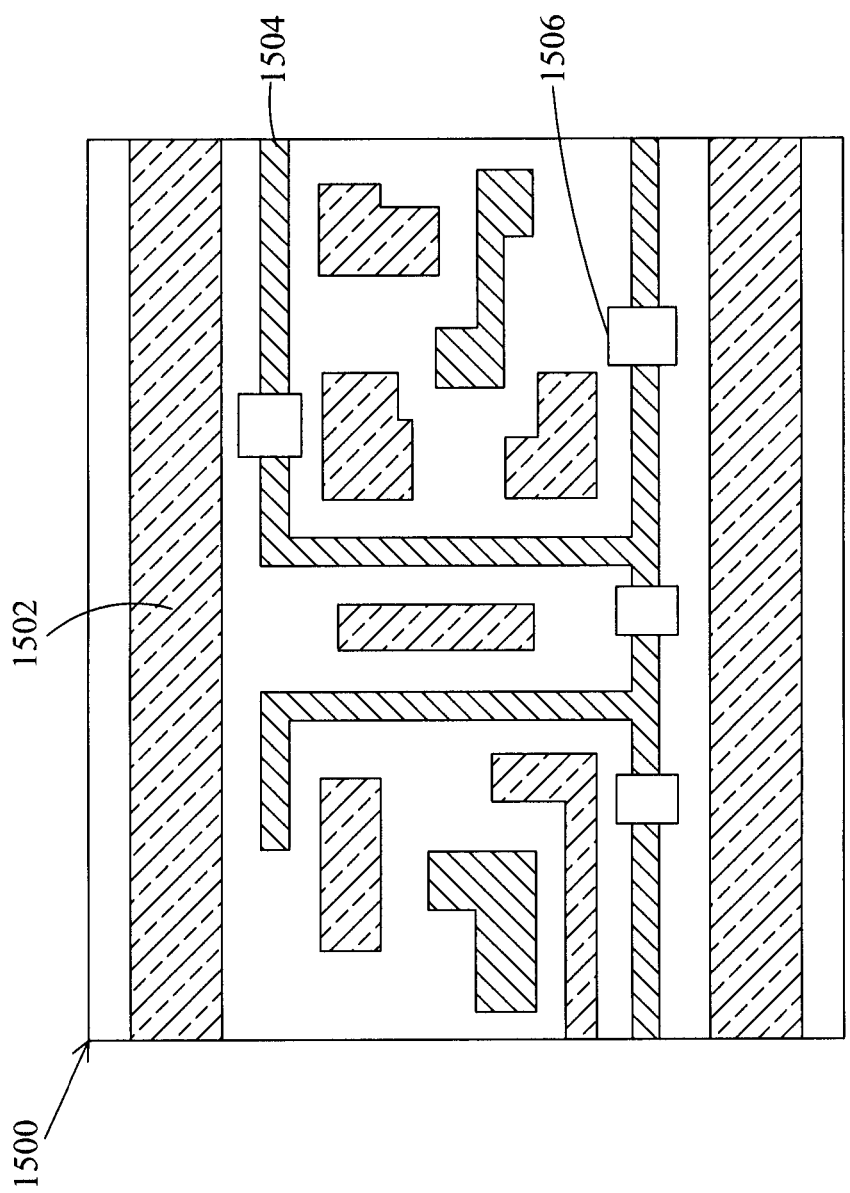
FIG. 15 illustrates an embodiment of a top view of a layout of a semiconductor device formed according to one or more aspects of the present disclosure.

Referring now to FIG. 15, illustrated is a layout 1500 of an IC device. A device associated with the layout 1500 may be fabricated using the method 100, described above with reference to FIGS. 1-14.

The layout 1500 includes a pattern 1502. The pattern 1502 may be formed substantially similar to the second pattern described above with reference to block 110 of the method 100 (see also, FIG. 7 defining masking element 708). The layout 1500 also includes a pattern 1504. The pattern 1504 may be substantially similar to that formed by the first masking element described above in block 104 of the method 100 (see also, FIG. 3 elements 310 and 312). The patterns 1502 and 1504 may define features of a metal layer of an interconnect structure, for example, the first and second patterns 1502 and 1504 may define conductive (e.g., copper) lines in one layer of a MLI of the device. The layout 1500 also includes a cut pattern 1506. The cut pattern 1506 may be substantially similar to the pattern described above with reference to block 104 of the method 100 and/or the pattern defined by opening 310 of the FIG. 3. It is noted that the cut pattern 1506 interposes two features of the pattern 1502 and defines a space in a feature of pattern 1504.

In summary, the methods and devices disclosed herein provide for forming features using a cut pattern. In doing so, one or more embodiments the present disclosure offers several advantages over prior art devices. Advantages of the present disclosure include providing a cut pattern (e.g., first pattern as described above) that has a larger CD and/or overlay margin because it is advanced before the pattern defining the features (e.g., interconnects). The cut pattern may also be formed using a larger size thus easing the lithography requirements of forming the pattern. Another advantage is that the cut pattern is advanced simultaneously with the patterning of the first pattern (e.g., interconnect feature).

Thus, described herein is an embodiment of a method. The method includes forming a first pattern on a semiconductor substrate having a target layer. The first pattern includes a first opening. The first opening is then filled with a fill material. A second pattern is formed on the semiconductor substrate, which includes a first feature and a second feature. The filled opening interposes the first and second features. Spacer elements are formed on sidewalls of the filled opening, the first feature and the second feature. After forming the spacer elements, the material comprising first and second features is removed to form a second opening and a third opening. The sidewalls of the second and third openings are defined by the spacer elements. The filled opening, the second opening and the third opening are used as a masking element to etch the target layer.

In a further embodiment, the first pattern also includes a fourth and fifth opening (see, e.g., FIG. 3 openings 312). The filling process may further include filling these fourth and fifth openings. The first and second features lie adjacent and transverse the filled fourth and the filled fifth opening.

In another further embodiment, the first and second features are photoresist. In an embodiment, the target layer is formed by depositing a hard mask material on a dielectric layer on the semiconductor substrate. The first opening may be filled by depositing a silicon-containing antireflective coating (Si-ARC). In an embodiment, the first opening is formed by depositing a tri-layer photoresist stack and etching the first opening in an underlying layer of the tri-layer photoresist stack. The spacer elements may then be formed on sidewalls of the filled opening, the first feature and the second feature.

In a further embodiment, forming the spacer elements includes forming a conformal layer of a dielectric material on the filled opening, the first feature and the second feature and then, removing the conformal layer from a top surface of each of the filled opening, the first feature and the second feature. In an embodiment, the filled opening, second opening and third opening are substantially coplanar. In a further embodiment, the etched target layer is used to form a conductive line of an interconnect structure.

In another of the broader embodiments of a method described herein, a method of semiconductor device fabrication is provided. The method includes forming a first photoresist element on a substrate. The first photoresist element has an opening therein. The opening is filled. The first photoresist element is then removed after filling the opening. Also after filling the opening, a second photoresist element and a third photoresist element are formed adjacent to and coplanar with the filled opening. A spacer element is formed on sidewalls of the second photoresist element and the third photoresist element. After forming the spacer elements, the second and third photoresist elements are removed. The filled opening and the spacer elements are used as a masking element to provide an interconnect layer of a semiconductor device.

In a further embodiment, the method includes using the filled opening and the spacer elements as masking elements to provide the interconnect layer by etching a hardmask layer through openings provided by the removal of the first and second photoresist elements and defined by the spacer elements. In an embodiment, spacer elements are also formed on sidewalls of the filled opening. The spacer elements may be disposed on four sidewalls of the filled opening. In an embodiment, using the filled opening and the spacer elements to provide an interconnect layer includes etching a hard mask layer.

In another of the broader forms of the methods described herein, a method provides for forming a first feature on a layer of a substrate using a first patterning process (see, e.g., FIG. 3 and the accompanying lithography process). A second patterning process (see, e.g., FIG. 7 and the accompanying lithography process) is then used to form a second feature and a third feature on the layer. A conformal layer is formed over the first, second, and third features. The conformal layer is etched back to expose a top surface of the first, second and third features. The second and third features are removed after exposing the top surface to form a first and second opening. Using the space, the first opening and the second opening, a trench (also referred to as opening) is formed in an underlying layer. The trenches are used to pattern an interconnect structure of a semiconductor device.

In a further embodiment, the interconnect structure is a copper metal line. In an embodiment, the second and third features include a photoresist material. Etching back the conformal layer can provide a planar surface including the conformal layer, and each of the first, second and third features.

In another further embodiment, a fourth feature and a fifth feature are formed using the first patterning process. (see, e.g., FIG. 3) The fourth feature is spaced a first distance from an end cap (e.g., terminal end of rectangular feature) of the second feature and the fifth feature is spaced a second distance from an end cap of the third feature. The conformal layer may fill this first and second distance. In some embodiments, the first feature, the fourth feature and the fifth feature each have a composition including silicon (e.g., Si-ARC).

It is understood however that different embodiments disclosed herein offer different disclosure, and that they may make various changes, substitutions and alterations herein without departing from the spirit and scope of the present disclosure.

What is claimed is:

1. A method, comprising:
   forming a first pattern of photoresist on a semiconductor substrate having a target layer, wherein the first pattern includes a first opening;
   filling the first opening with a fill material, thereby forming a filled opening;
   removing the first pattern of photoresist after forming the filled opening;
   using another photoresist material, forming a second pattern on the semiconductor substrate, wherein the second pattern includes a first feature and a second feature, the filled opening interposing the first and second features;
   forming spacer elements on sidewalls of the filled opening, the first feature, and the second feature;
   after forming the spacer elements, removing material comprising the first and second features to form a second opening and a third opening, wherein sidewalls of the second and third openings are defined by the spacer elements; and
   using the filled opening, the second opening and the third opening as a masking element to etch the target layer.

2. The method of claim 1, wherein the forming the first pattern further includes forming fourth and fifth openings; wherein the filling further includes filling the fourth and fifth openings to form a filled fourth opening and a filled fifth opening; and wherein the first and second features each are disposed adjacent to and transverse to the filled fourth opening and the filled fifth opening.

3. The method of claim 1, wherein the forming the second pattern includes forming the first and second features of photoresist.

4. The method of claim 1, further comprising:
   forming the target layer by depositing a hard mask material on a dielectric layer on the semiconductor substrate.

5. The method of claim 1, wherein filling the first opening includes depositing a silicon-containing antireflective coating (Si-ARC).

6. The method of claim 1, wherein the forming the first opening includes depositing a tri-layer photoresist stack and etching the first opening in an underlying layer of the tri-layer photoresist stack.

7. The method of claim 6, wherein the forming the spacer elements on sidewalls of the filled opening, the first feature and the second feature further comprising:
   forming a conformal layer of a dielectric material on the filled opening, the first feature and the second feature; and
   removing the conformal layer from a top surface of each of the filled opening, the first feature and the second feature.

8. The method of claim 7, wherein the filled opening, the second opening and the third opening are substantially coplanar.

9. The method of claim 1, further comprising:
   using the etched target layer to form a conductive line of an interconnect structure.

10. A method of semiconductor fabrication, comprising:
    forming a first photoresist element on a substrate, wherein the first photoresist element has an opening therein;
    filling the opening to form a filled opening;
    removing the first photoresist element after filling the opening;
    after filling the opening and removing the first photoresist element, forming a second photoresist element and a third photoresist element adjacent to and coplanar with the filled opening;
    forming spacer elements on sidewalls of the second photoresist element and the third photoresist element;
    after forming the spacer elements, removing the second and third photoresist elements; and
    using the filled opening and the spacer elements as a masking element to provide an interconnect layer of a semiconductor device.

11. The method of claim 10, wherein using the filled opening and the spacer elements as the masking element to provide the interconnect layer includes etching a hardmask layer through openings provided by the removal of the first and second photoresist elements and defined by the spacer elements.

12. The method of claim 10, wherein the forming the spacer elements on sidewalls of the second photoresist element and the third photoresist element further includes forming spacer elements on sidewalls of the filled opening.

13. The method of claim 12, wherein the spacer elements are disposed on four sidewalls of the filled opening.

14. The method of claim 10, wherein the using the filled opening and the spacer elements to provide an interconnect layer includes etching a hard mask layer.

15. A method, comprising:
    forming a first feature on a layer of a substrate using a first patterning process;
    after forming the first feature, forming a second feature and a third feature on the layer of the substrate using a second patterning process, wherein the first feature interposes the second and third features and wherein a space surrounds the first feature;
    forming a conformal layer over the first, second, and third features;
    etching back the conformal layer to expose a top surface of the first, second and third features;
    removing the second and third features after exposing the top surface to form a first and second opening without removing the first feature;
    using the space, the first opening and the second opening to form trenches in an underlying layer; and
    using the trenches to pattern an interconnect structure of a semiconductor device.

16. The method of claim 15, wherein the interconnect structure is a copper metal line.

17. The method of claim 15, wherein the second and third features include a photoresist material.

18. The method of claim 15, wherein the etching back the conformal layer to expose the top surface of the first, second and third features provides a planar surface including the conformal layer and each of the first, second and third features.

19. The method of claim 15, further comprising:
    forming a fourth feature and a fifth feature using the first patterning process, wherein the fourth feature is spaced a first distance from an end cap of the second feature and the fifth feature is spaced a second distance from an end cap of the third feature, and wherein the forming the conformal layer fills regions of the first distance and the second distance.

20. The method of claim 19, further comprising:
wherein the first feature, the fourth feature and the fifth feature have a composition including silicon.

\* \* \* \* \*